United States Patent
Runyon et al.

(10) Patent No.: US 10,326,210 B2
(45) Date of Patent: Jun. 18, 2019

(54) ENHANCED DIRECTIVITY FEED AND FEED ARRAY

(71) Applicant: VIASAT, INC., Carlsbad, CA (US)

(72) Inventors: Donald L Runyon, Johns Creek, GA (US); Anders Jensen, Johns Creek, GA (US); Ken J Larson, Escondido, CA (US); Jason T. King, San Marcos, CA (US); Joseph M. Carlson, Carlsbad, CA (US)

(73) Assignee: VIASAT, INC., Carlsbad, CA (US)

(*) Notice: Subject to any disclaimer, the term of this patent is extended or adjusted under 35 U.S.C. 154(b) by 0 days.

(21) Appl. No.: 15/806,181

(22) Filed: Nov. 7, 2017

(65) Prior Publication Data

US 2018/0069320 A1    Mar. 8, 2018

Related U.S. Application Data

(63) Continuation of application No. 14/633,427, filed on Feb. 27, 2015, now Pat. No. 9,843,104.

(51) Int. Cl.

| | |
|---|---|
| *H01Q 19/13* | (2006.01) |
| *H01Q 13/02* | (2006.01) |
| *H01Q 21/30* | (2006.01) |
| *H01Q 15/24* | (2006.01) |
| *H01Q 21/06* | (2006.01) |
| *G06F 17/50* | (2006.01) |

(52) U.S. Cl.
CPC .......... *H01Q 19/132* (2013.01); *G06F 17/50* (2013.01); *H01Q 13/02* (2013.01); *H01Q 13/0241* (2013.01); *H01Q 15/242* (2013.01); *H01Q 21/064* (2013.01); *H01Q 21/30* (2013.01)

(58) Field of Classification Search
CPC ...... H01Q 13/02; H01Q 21/30; H01Q 21/064; H01Q 13/0241; H01Q 15/242; H01Q 19/132; H01Q 5/307; G06F 17/50
See application file for complete search history.

(56) References Cited

U.S. PATENT DOCUMENTS

| | | | |
|---|---|---|---|
| 2,567,577 A | * | 9/1951 | Pariser ................. H01Q 1/1228 343/803 |
| 4,115,782 A | | 9/1978 | Han et al. |

(Continued)

OTHER PUBLICATIONS

Applicant Admitted Prior Art already entered: Cummings, An Adaptive Nulling Antenna for Military Satellite Communications, The Lincoln Lab. Journal, vol. 5, No. 2, pp. 173-194, 1992.*

(Continued)

*Primary Examiner* — Graham P Smith
*Assistant Examiner* — Jae K Kim
(74) *Attorney, Agent, or Firm* — Fountainhead Law Group P.C.

(57) ABSTRACT

Disclosed is a shaped horn in conjunction with a dielectric tube for enhanced aperture directivity that can achieve a near optimum efficiency. The shaped horn provides additional mode control to provide an improved off-axis cross-polarization response. The horn shape can be individually optimized for isolated horns or for horns in a feed array. The feed array environment can produce results that lead to a different optimized shape than the isolated horn. Lower off axis cross-polarization can result in improved efficiency and susceptibility to interference.

10 Claims, 16 Drawing Sheets

(56) References Cited

U.S. PATENT DOCUMENTS

| | | | | |
|---|---|---|---|---|
| 6,168,574 B1 * | 1/2001 | VanDemark | ....... | A61H 33/6036 |
| | | | | 285/317 |
| 6,587,246 B1 * | 7/2003 | Anderton | ................ | G01S 3/789 |
| | | | | 250/234 |
| 2002/0000945 A1 * | 1/2002 | Amyotte | ............ | H01Q 13/0208 |
| | | | | 343/786 |
| 2002/0171596 A1 | 11/2002 | Em et al. | | |
| 2006/0125706 A1 * | 6/2006 | Amyotte | ............ | H01Q 13/0208 |
| | | | | 343/786 |
| 2016/0254601 A1 | 9/2016 | Runyon et al. | | |

OTHER PUBLICATIONS

Yang-Su Kim et al, "Design and Measurements of Ka-band Waveguide Dielectric Rod Antenna for 7 Channel Digital Beamformer for HAPS", Jan. 1, 2004, pp. 25-28, IEEE.

S.A. Brunstein et al, "Characteristics of a Cigar Antenna", JPL Quarterly Technical Review, Jul. 1971, pp. 38-95, vol. 1, No. 2.

William C. Cummings, "An Adaptive Nulling Antenna for Military Satellite Communications", The Lincoln Laboratory Journal, Jan. 1, 1992, pp. 173-193, vol. 5, No. 2.

Alan J. Fenn et al, "High-Resolution Adaptive Nulling Performance for a Lightweight Agile EHF Multiple Beam Antenna", IEEE MTT-S Digest, Jan. 1, 1995, pp. 1217-1220, Massachusetts Institute of Technology, Lexington, MA.

L.W. Rispin et al., "A Multiple-Aperture Multiple-Beam EHF Antenna for Satellite Communications," Aug. 13, 1992, 27 pages, Massachusetts Institute of Technology, Lexington, MA.

* cited by examiner

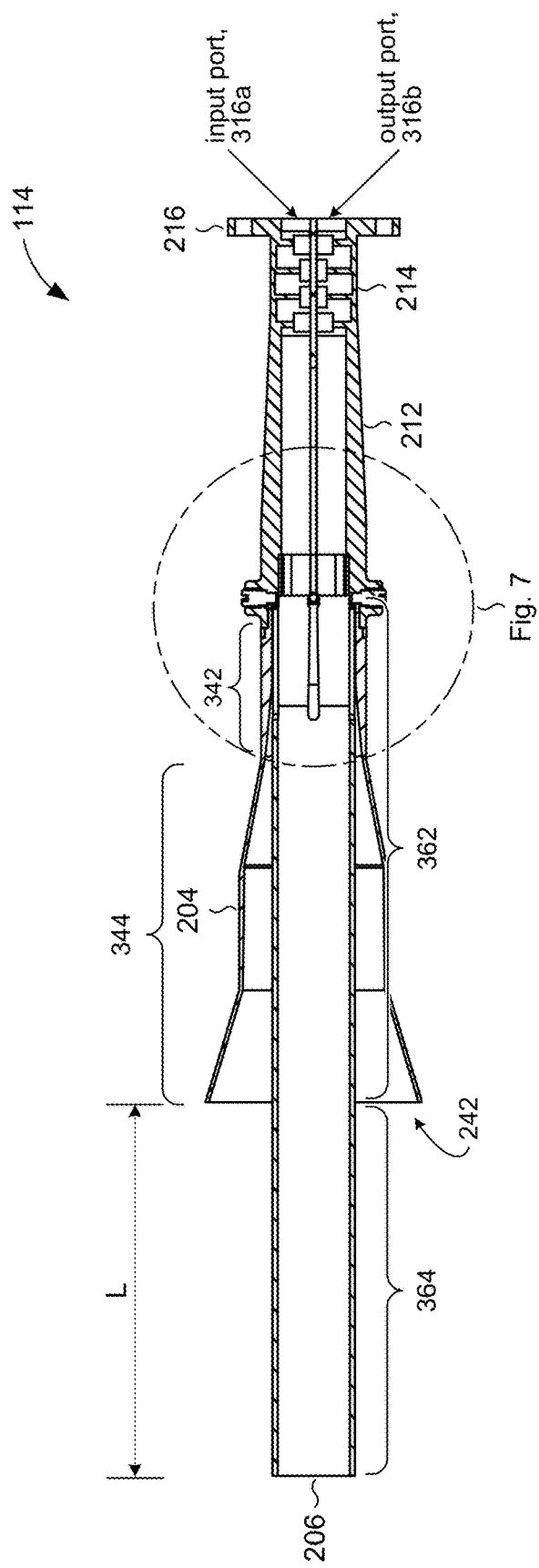

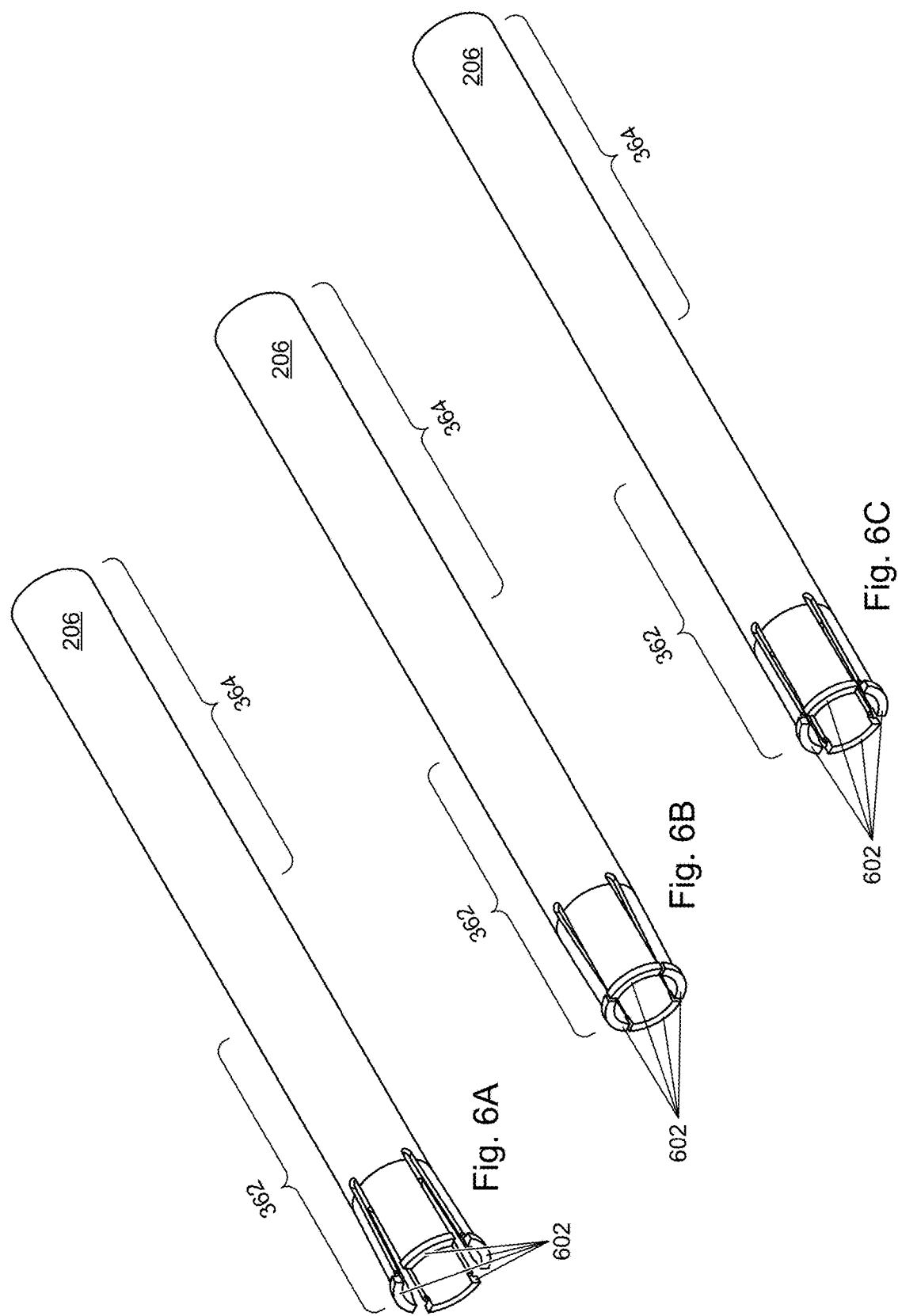

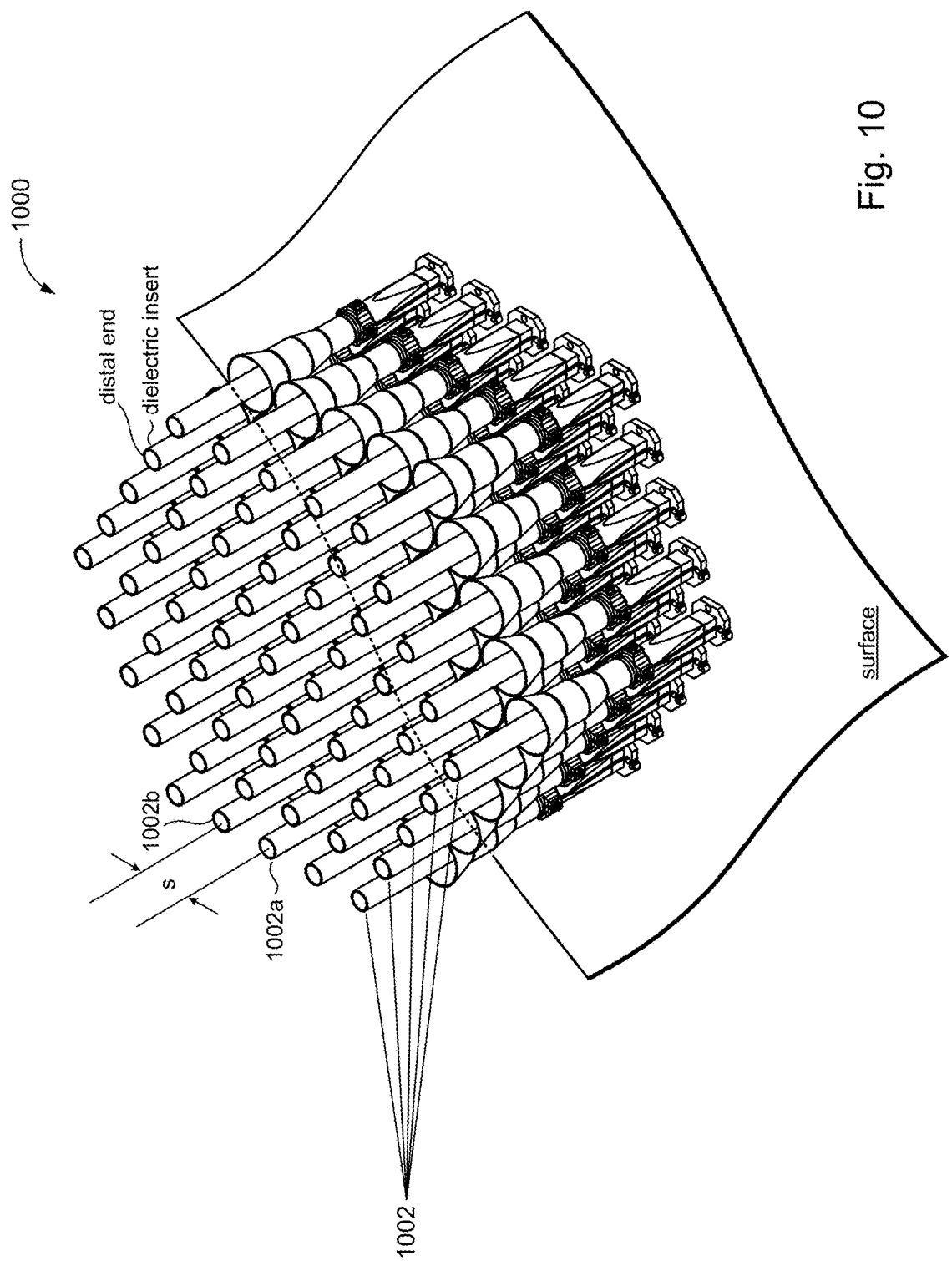

ENHANCED DIRECTIVITY FEED AND FEED ARRAY

CROSS REFERENCE TO RELATED APPLICATIONS

This application is a continuation application and, pursuant to 35 U.S.C. § 120, is entitled to and claims the benefit of U.S. application Ser. No. 14/633,427 filed Feb. 27, 2015, the content of which is incorporated herein by reference in its entirety for all purposes.

BACKGROUND

Satellite antennas using reflectors for gain and multiple feeds in the configuration of single-feed-per-beam (SFPB) or multiple-feeds-per-beam (MFPB) to produce contiguous spot beam patterns or area coverage patterns have a limitation in which the feed aperture area can be insufficient to illuminate the reflector efficiently. In general, the spillover energy may exceed the optimum value that can be achieved by a single feed sized to provide a net optimum efficiency. In other words, the reflector aperture can be over illuminated and the energy radiated by the feed spilling past the reflector boundary can be greater than the optimum for net efficiency.

The over illumination condition can exist over the practical ranges of focal length values, and generally applies to single reflector optics and to dual-reflector optics. The over illumination condition exists for transmission type convergent optics (e.g., lens) as well as reflector convergent optics. Convergent optics captures radio frequency (RF) energy over a defined area and redirects the energy to a smaller area. The over illumination condition can occur for defocused or focused positions of feeds arranged in a contiguous manner to form contiguous spot beams with reasonable gain loss at the secondary pattern two-beam and three-beam cross-over locations. A similar over illumination condition may arise in the case of an MFPB configuration, where the reflector or lens feeds are defocused to configure a phased array fed reflector antenna.

An approach in SFPB spot beam satellite system applications to improve the illumination uses multiple reflectors for a congruent coverage area and assigns near focused feeds to reflectors in a manner to avoid having contiguous coverage beams within a single reflector.

Another solution uses feed clusters (e.g., 3, 7, 13 elements) and relatively complex orthogonal waveguide beamforming networks to provide overlapping excitation of adjacent feeds to form each beam.

Mitigation examples exist for the over-illumination condition, in which the modes within a feed horn are controlled in an attempt to produce a near uniform amplitude distribution at the horn aperture. In these mode control examples, the near uniform amplitude distribution can be an approximation to the TEM mode in the feed horn structure. Another mitigation example maximizes the feed aperture area in a triangular feed lattice and uses horns having a hexagonal shaped boundary. Neither of these configurations provides optimum illumination conditions and may exhibit only marginal performance improvements over the more common geometry limited configurations.

SUMMARY

In accordance with the present disclosure, an antenna may include a reflector and an array of feeds. Each feed in the array may include a horn having a multi-flare mode conversion section having several flare angles. Each feed may include a dielectric insert having a portion that extends through a part of the multi-flare mode conversion section and a portion that extends beyond an aperture of the multi-flare mode conversion section.

The following detailed description and accompanying drawings provide a better understanding of the nature and advantages of the present disclosure.

BRIEF DESCRIPTION OF THE DRAWINGS

With respect to the discussion to follow and in particular to the drawings, it is stressed that the particulars shown represent examples for purposes of illustrative discussion, and are presented in the cause of providing a description of principles and conceptual aspects of the present disclosure. In this regard, no attempt is made to show implementation details beyond what is needed for a fundamental understanding of the present disclosure. The discussion to follow, in conjunction with the drawings, make apparent to those of skill in the art how embodiments in accordance with the present disclosure may be practiced. In the accompanying drawings:

FIG. 3A is a cross-sectional view of the feed assembly illustrated in FIG. 2.

FIGS. 6A, 6B, and 6C illustrate various embodiments of a dielectric insert in accordance with the present disclosure.

FIG. 10 illustrates an example of a feed array in accordance with the present disclosure.

DETAILED DESCRIPTION

In the following description, for purposes of explanation, numerous examples and specific details are set forth in order to provide a thorough understanding of the present disclosure. It will be evident, however, to one skilled in the art that the present disclosure as expressed in the claims may include some or all of the features in these examples, alone or in combination with other features described below, and may further include modifications and equivalents of the features and concepts described herein.

Satellite Communication Systems

Figure 1:
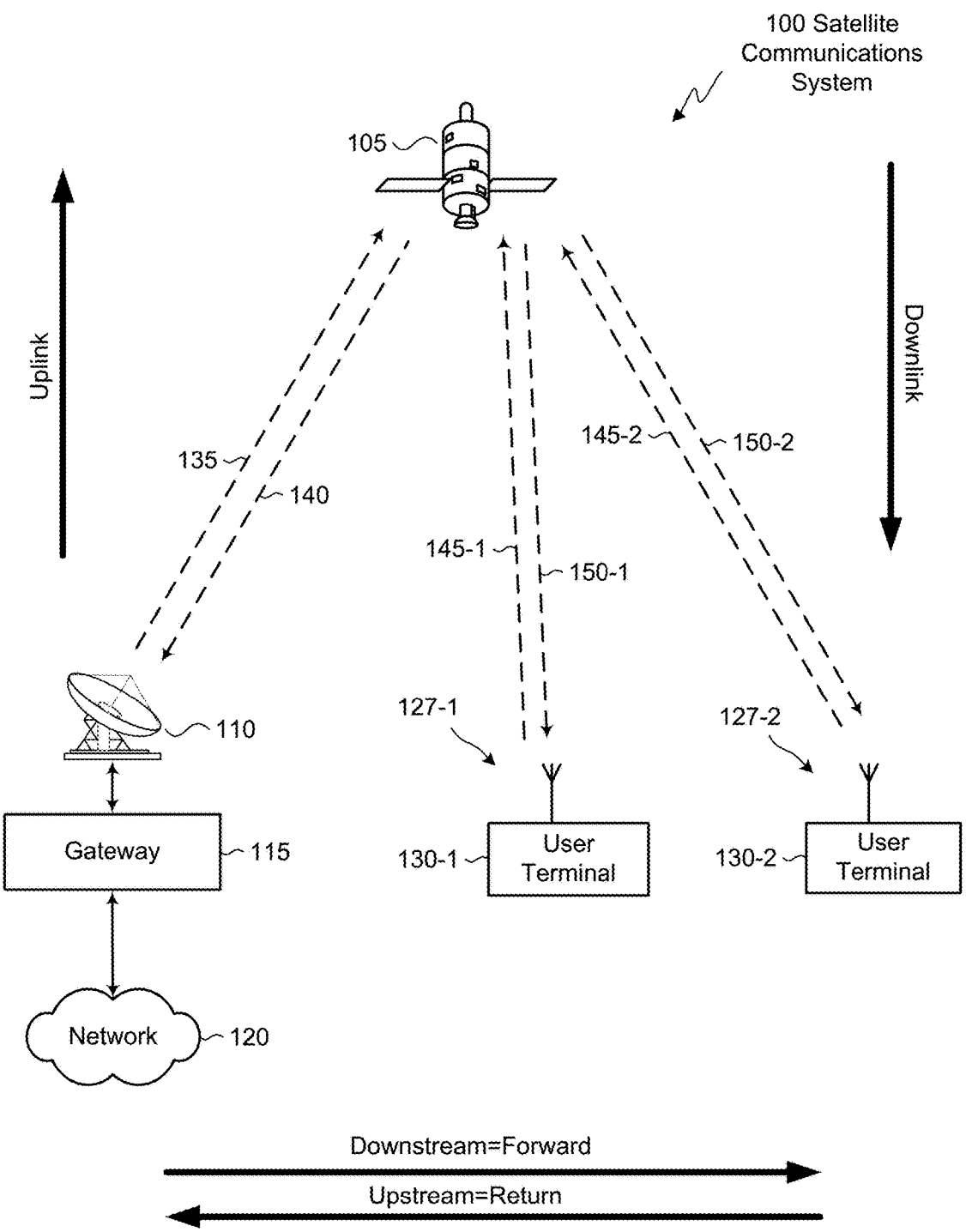
FIG. 1 is a block diagram of a satellite communication system that can be improved by various embodiments of the present disclosure.

FIG. 1 is a diagram of an example satellite communications system 100 that may be improved by systems, methods, and devices of the present disclosure. Satellite communication system 100 includes a network 120 interfaced with one or more gateway terminals 115.

Gateway terminal 115 may be configured to communicate with one or more user terminals 130 via satellite 105. As used herein the term "communicate" may refer to both transmitting and receiving (i.e., bidirectional communication) or may refer to either transmitting or receiving (i.e., unidirectional communication) over a particular pathway.

Gateway terminal 115 may be referred to herein as the hub or ground station. Gateway terminal 115 may service uplink 135 and downlink 140 to and from satellite 105. Gateway terminal 115 may also schedule traffic to user terminals 130. Alternatively, the scheduling may be performed in other parts of satellite communication system 100. Although only one gateway terminal 115 is shown in FIG. 1 to avoid over complication of the drawing, embodiments in accordance with the present disclosure may be implemented in satellite communication systems having multiple gateway terminals 115, each of which may be coupled to each other and/or one or more networks 120. Even in wideband satellite communication systems, the available frequency spectrum is limited. Communication links between gateway terminal 115 and satellite 105 may use the same, overlapping, or different frequencies as communication links between satellite 105 and user terminals 130. Gateway terminal 115 may also be located remotely from user terminals 130 to enable frequency reuse. By separating the gateway terminal 115 and user terminals 130, spot beams with common frequency bands can be geographically separated to avoid interference.

Network 120 may be any type of network and can include for example, the Internet, an IP network, an intranet, a wide area network (WAN), a local area network (LAN), a virtual private network (VPN), a virtual LAN (VLAN), a fiber optic network, a cable network, a public switched telephone network (PSTN), a public switched data network (PSDN), a public land mobile network, and/or any other type of network supporting communications between devices as described herein. Network 120 may include both wired and wireless connections as well as optical links. Network 120 may connect gateway terminal 115 with other gateway terminals that may be in communication with satellite 105 or with other satellites.

Gateway terminal 115 may be provided as an interface between network 120 and satellite 105. Gateway terminal 115 may be configured to receive data and information directed to one or more user terminals 130. Gateway terminal 115 may format the data and information for delivery to respective terminals 130. Similarly gateway terminal 115 may be configured to receive signals from satellite 105 (e.g., from one or more user terminals 130) directed to a destination accessible via network 120. In some embodiments, gateway terminal 115 may also format the received signals for transmission on network 120. In some embodiments, gateway terminal 115 may use antenna 110 to transmit forward uplink signal 135 to satellite 105. Antenna 110 may comprise a reflector with high directivity in the direction of satellite 105 and low directivity in other directions. Antenna 110 may comprise a variety of alternative configurations which include operating characteristics such as high isolation between orthogonal polarizations, high-efficiency in the operational frequency band, low noise, and the like.

Satellite 105 may be a geostationary satellite that is configured to receive forward uplink signals 135 from the location of antenna 110 using a reflector antenna (not shown) described in more detail below with respect to FIG. 1A. Satellite 105 may receive the signals 135 from gateway terminal 115 and forward corresponding downlink signals 150 to one or more of user terminals 130. The signals may be passed through a transmit reflector antenna (e.g., reflector antenna described in more detail below with respect to FIG. 1A) to form the transmission radiation pattern (e.g., a spot beam). Satellite 105 may operate in multiple spot beam mode, transmitting and receiving a number of narrow beams directed to different regions on the earth. This allows for segregation of user terminals 130 into various narrow beams. Alternatively, the satellite 105 may operate in wide area coverage beam mode, transmitting one or more wide area coverage beams to multiple receiving user terminals 130 simultaneously.

Satellite 105 may be configured as a "bent pipe" or relay satellite. In this configuration, satellite 105 may perform frequency and polarization conversion of the received carrier signals before retransmission of the signals to their destination. A spot beam may use a single carrier, i.e. one frequency, or a contiguous frequency range per beam. In various embodiments, the spot or area coverage beams may use wideband frequency spectra. A variety of physical layer transmission modulation encoding techniques may be used by satellite 105 (e.g., adaptive coding and modulation). Satellite 105 may use on-board beamforming techniques or rely on off-board (ground based) beamforming techniques.

Figure 1A:
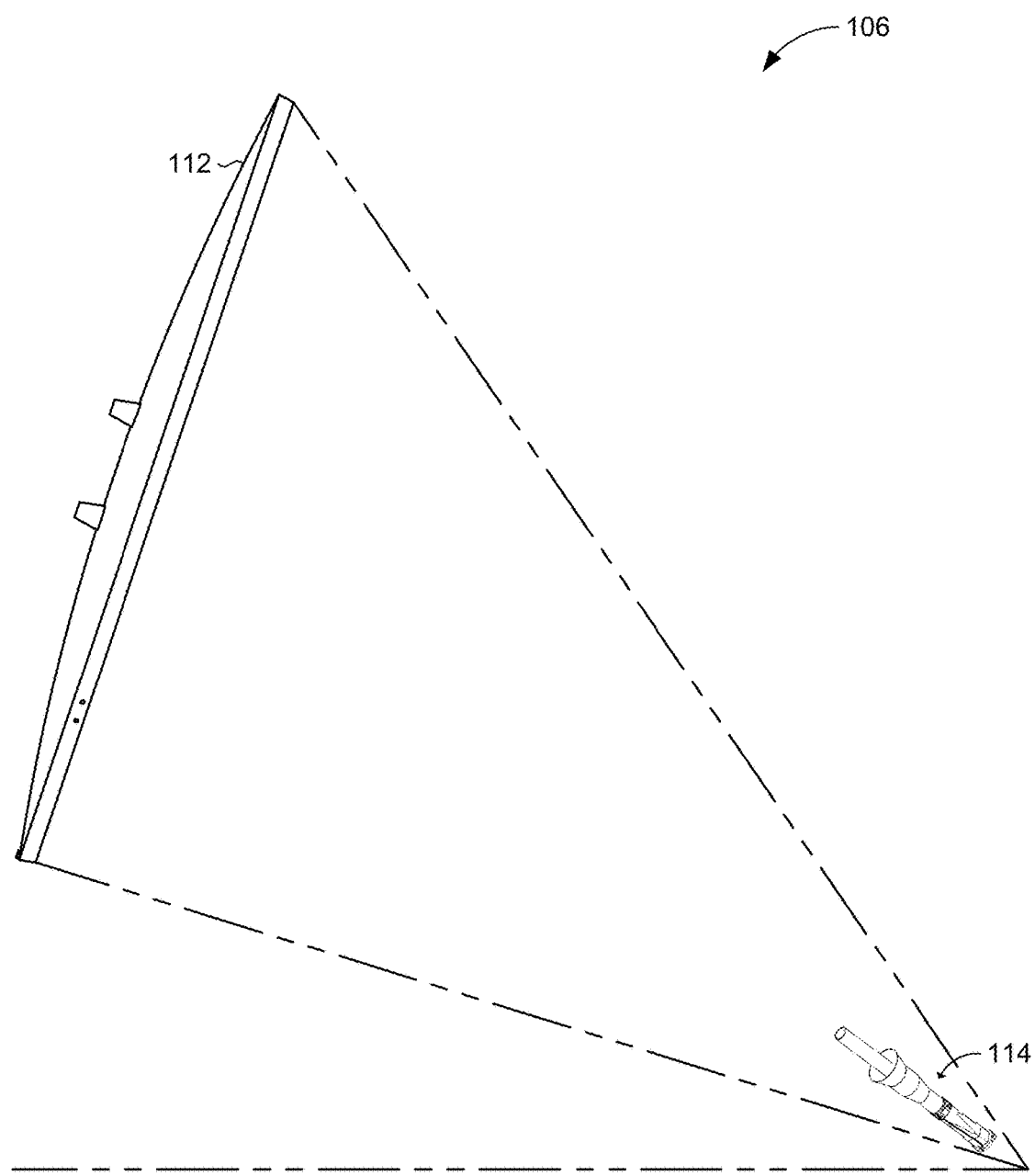
FIG. 1A shows some details of a reflector antenna for satellite 105 depicted in FIG. 1.

Referring for a moment to FIG. 1A, in some embodiments, a reflector antenna 106 for satellite 105 may comprise a reflector 112 and a feed assembly 114 (described in more detail below) to illuminate the reflector 112 in accordance with the present disclosure. The figure shows an offset parabolic reflector configuration. However, embodiments in accordance with the present disclosure may use other antenna configurations. In some embodiments, the reflector 112 may be parabolic as depicted in FIG. 1A, for example. In other embodiments, the reflector 112 may have any spherical, aspherical, bi-focal, or offset concave shaped profile necessary for the generation of the desired transmission and receiving beams. In other embodiments, the reflector 112 may be used in conjunction with one or more additional reflectors in a system of reflectors. The system of reflectors may be comprised of one or more profiles such as parabolic, spherical, ellipsoidal, or shaped, and may be arranged in classical microwave optical arrangements such as Cassegrain, Gregorian, Dragonian, offset, side-fed, front-fed or similarly configured optics systems known in the art.

Returning to FIG. 1, satellite communication system 100 may use a number of network architectures consisting of space and ground segments. The space segment may include one or more satellites 105 while the ground segment may include one or more user terminals 130, gateway terminals 115, network operation centers (NOCs) and satellite and gateway terminal command centers. The terminals may be connected by a mesh network, a star network, or the like as would be evident to those skilled in the art.

Forward downlink signals 150 may be transmitted from satellite 105 to one or more user terminals 130. User terminals 130 may receive downlink signals 150 using antennas 127. In one embodiment, for example, antenna 127 and user terminal 130 together comprise a very small aperture terminal (VSAT), with antenna 127 measuring approximately 0.6 m in diameter and having approximately 2 W of power. In other embodiments, a variety of other types of antenna 127, including PAFR antennas, may be used as user terminals 130 to receive downlink signals 150 from satellite 105. Each of the user terminals 130 may comprise a single user terminal or, alternatively, may comprise a hub or router, not shown, that is coupled to multiple user terminals. Each user terminal 130 may be connected to various consumer electronics comprising, for example, computers, local area networks, Internet appliances, wireless networks, and the like.

In some embodiments, a multi-frequency time division multiple access (MF-TDMA) scheme may be used for upstream links 140 and 145, allowing efficient streaming of traffic while maintaining flexibility and allocating capacity among each of the user terminals 130. In these embodiments, a number frequency channels may be allocated statically or dynamically. A time division multiple access (TDMA) scheme may also be employed in each frequency channel. In this scheme, each frequency channel may be divided into several timeslots that can be assigned to a connection (i.e., a user terminal 130). In other embodiments, one or more of the upstream links 140, 145 may be configured using other schemes, such as frequency division multiple access (FDMA), orthogonal frequency division multiple access (OFDMA), code division multiple access (CDMA), or any number of hybrid or other schemes known in the art.

User terminal 130 may transmit data and information to a network 120 destination via satellite 105. User terminal 130 may transmit the signals by upstream link 145 to satellite 105 using antenna 127. User terminal 130 may transmit the signals according to various physical layer transmission modulation encoding techniques, including for example, those defined with the DVB-S2, WiMAX, LTE, and DOCSIS standards. In various embodiments, the physical layer techniques may be the same for each of the links 135, 140, 145, 150, or they may be different.

Satellite 105 may support non-processed, bent pipe architectures with one or more reflector antennas as described herein to produce multiple small spot beam patterns. The satellite 105 can include J generic pathways, each of which can be allocated as a forward pathway or a return pathway at any instant of time. Large reflectors may be illuminated by a phased array of feeds to provide the ability to make arbitrary spot and area coverage beam patterns within the constraints set by the size of the reflector and the number and placement of the feeds. Reflector antennas may be employed for both receiving uplink signals 130, 140, transmitting downlink signals 140, 150, or both in a full duplex mode. The beam forming networks (BFN) associated with the receive (Rx) and transmit (Tx) reflector antennas may be dynamic, allowing for quick movement of the locations of both the Tx and Rx beams. The dynamic BFN may be used to quickly hop both Tx and Rx wideband beam positions.

Feed Assembly

Figure 2:
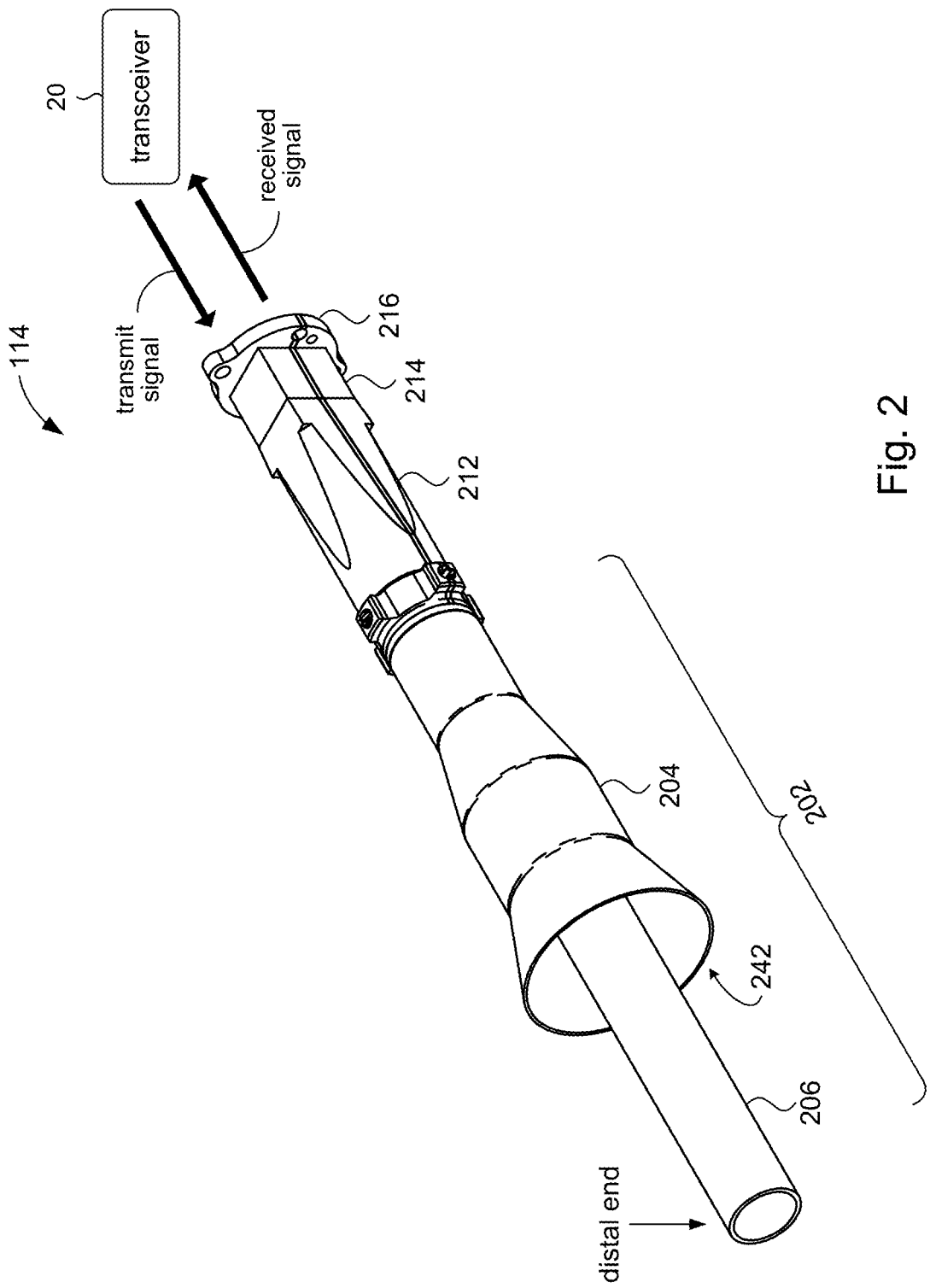
FIG. 2 is an isometric view of a feed assembly in accordance with an illustrative embodiment of the present disclosure.

FIG. 2 shows an illustrative embodiment of feed assembly 114 (FIG. 1A) in accordance with the present disclosure. In some embodiments, the feed assembly 114 may comprise a feed 202. The feed 202 may comprise a horn 204 and a dielectric insert 206. The dielectric insert 206 may have a first portion (e.g., 362, FIG. 3) disposed within the horn 204, and a second portion (e.g., 362, FIG. 3) that extends beyond an aperture 242 of the horn 204.

In some embodiments, the feed assembly 114 may further comprise a waveguide 212 to guide the electromagnetic (EM) waves of a transmit signal or a received signal between a coupling flange 216 and the feed 202. For example, the waveguide 212 may provide a transmit signal, produced by transceiver 20 (or other suitable transmitter unit) and received at an input port (e.g., 316a, FIG. 3A) of the coupling flange 216, to feed 202 for transmission by an antenna (e.g., reflector antenna 106, FIG. 1A). Conversely, the waveguide 212 may provide a signal received by the antenna (e.g., reflector antenna 106, FIG. 1A) to an output port (e.g., 316b, FIG. 3A) of the coupling flange 216 to the transceiver 20 (or other suitable receiver unit). In some embodiments, the waveguide 212 may be a rectangular waveguide (e.g., a square waveguide). In other embodiments, the waveguide 212 may be a circular waveguide. In some embodiments, the waveguide 212 may be ridge loaded, and in other embodiments other waveguide configurations may be used.

In some embodiments, the feed assembly 114 may further comprise an adapter 214 coupled to the waveguide 212. The adapter 214 may be a filter, a polarizer, a diplexer, or other suitable radio frequency (RF) component. In various embodiments, for example, the adapter 214 may be a four-port or two-port orthomode transducer (OMT), the adapter 214 may be a single-band or dual-band septum polarizer, and so on. In other embodiments, the adapter 214 may be a combination of a polarizer and a diplexer, the adapter 214 may be a combination of a polarizer and a filter (e.g., high pass, low pass, bandpass), and so on.

The coupling flange 216 may be used to mount the feed assembly 114 to a suitable structural support and/or to other antenna structures. As explained above, the coupling flange 216 may include ports (e.g., 316a, 316b, FIG. 3A) that serve as an input port and an output port.

Figure 3:
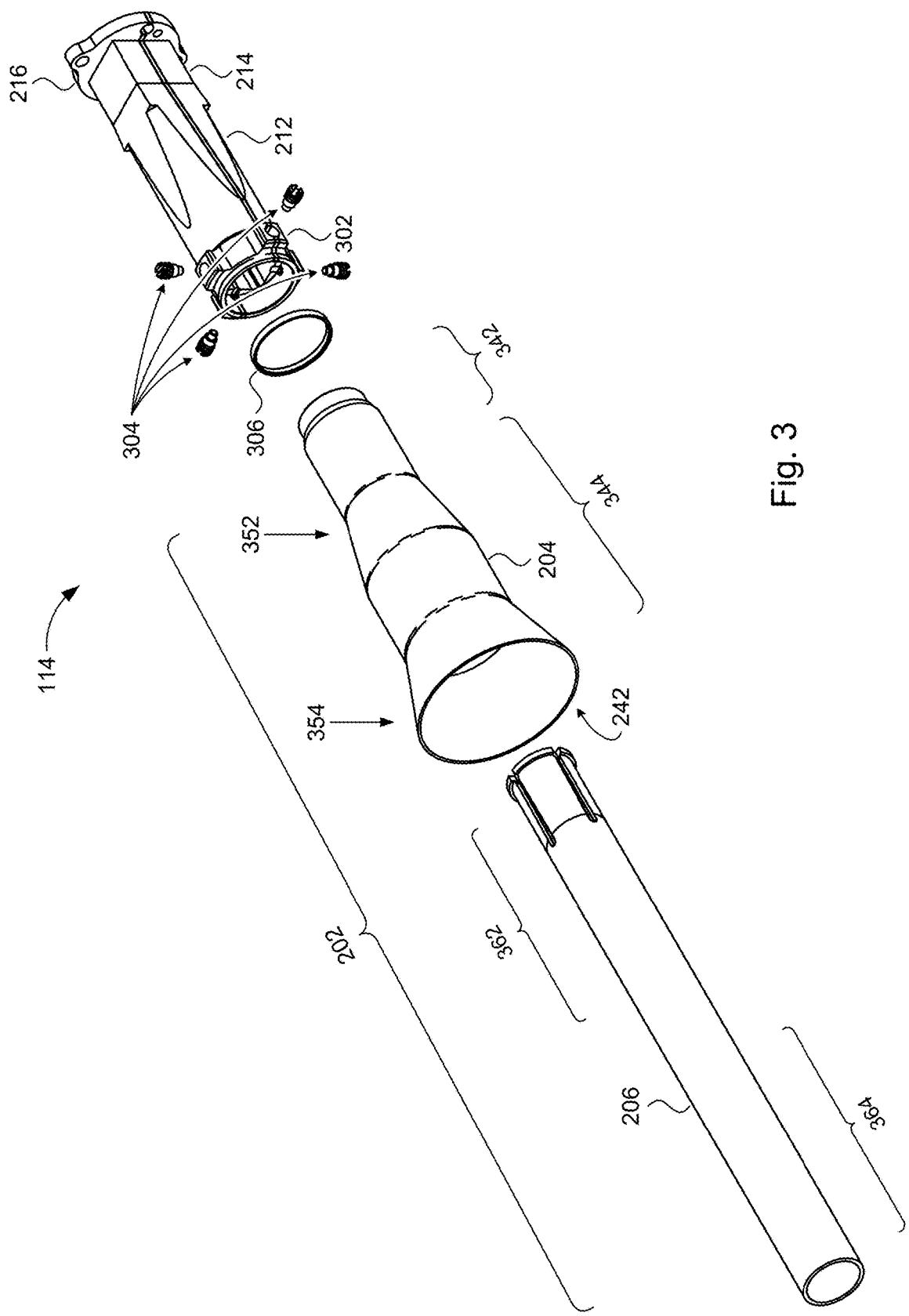
FIG. 3 is an exploded view of the feed assembly illustrated in FIG. 2.

FIG. 3 shows an exploded view of the feed assembly 114 depicted in FIG. 2. In accordance with some embodiments, the horn 204 may be circular waveguide comprising a first waveguide section 342 and a second waveguide section 344 coupled to or otherwise joined to the first waveguide section 342. The first waveguide section 342 may be a circular waveguide. The second waveguide section 344 may be referred to herein as a multi-flare mode conversion section 344. The multi-flare mode conversion section 344 may be characterized by several different flare angles between a first end 352 and a second end 354 of the multi-flare mode conversion section 344.

The dielectric insert 206 may comprise a first portion 362, which can be disposed within the volume of the horn 204. A second portion 364 of the dielectric insert 206 may extend beyond the aperture 242 of horn 204.

The waveguide 212 may include a collar 302 configured to couple the waveguide 212 the horn 204, for example, at the first waveguide section 342. Locking screws 304 may secure the horn 204 and/or dielectric insert 206 to the waveguide 212. The locking screws 304 may, for example, be made from electrically conductive material such as metal. As another example, the locking screws 304 may be made from non-conductive material. In some embodiments, the horn 204 may be fixedly attached to the first waveguide section 342 using a welding or bonding technique. In some embodiments, the horn 204 and first waveguide section 342 may be made of a single additive construction method such as electroforming or direct laser sintering or other known manufacturing processes in the art. In some embodiments, a waveguide seal 306 may be provided to block or otherwise reduce RF leakage where the horn 202 joins the waveguide 212. In some embodiments, a secondary dielectric insert (not shown) may be installed surrounding the dielectric insert 206 to secure the dielectric insert 206 to the waveguide 212.

FIG. 3A shows a cross sectional view of the feed assembly 114 depicted in FIG. 2. The cross sectional view illustrates that, in some embodiments, the first portion 362 of dielectric insert 206 may extend through the multi-flare mode conversion section 344 of horn 204. The second portion 364 may extend beyond the aperture 242 of horn 204 by a given length, L. The cross sectional view further illustrates the input port and the output port formed through the coupling flange 216.

Figure 4:
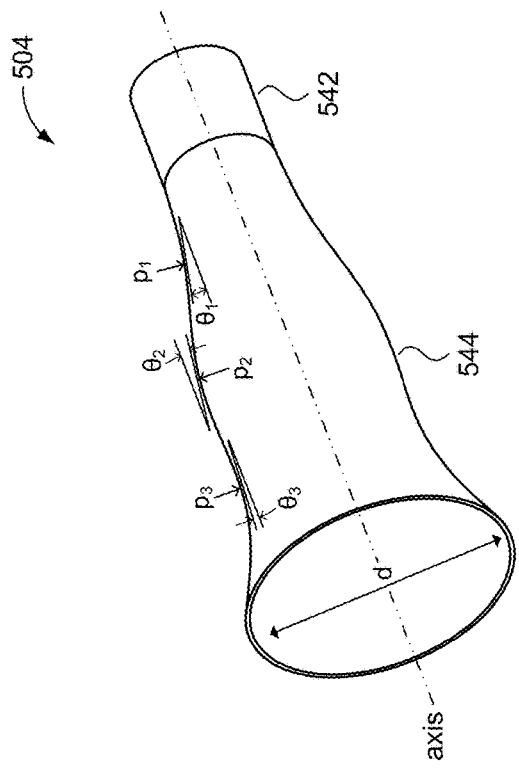
FIGS. 4 and 4A illustrate, respectively, an isometric view and a cross sectional view of an illustrative embodiment of a horn in accordance with the present disclosure.

FIG. 4 shows details of horn 204 in accordance with the present disclosure. In some embodiments, the horn 204 may comprise several horn segments 412a, 412b, 412c, 412d. For example, the first waveguide section 342 may comprise horn segment 412a. The multi-flared mode conversion section 344 may comprise horn segments 412b, 412c, 412d. It will be appreciated that either or both the first waveguide section 342 and the multi-flared mode conversion section 344 may comprise fewer or more horn segments.

The horn segments 412a-412d may have a circular cross section. In some embodiments, the horn segments 412a-412d may be a metal such as copper, aluminum, etc. In other embodiments, the horn segments 412a-412d may be a metal alloy such as brass, zinc alloy, etc. Each horn segment 412a, 412b, 412c may be joined to a respective horn segment 412b, 412c, 412d, defining respective transitions 414a, 414b, 414c at the joints. Any suitable joining technique may be used to join the horn segments 412a-412d, including, for example, soldering, brazing, welding, and the like.

Figure 4A:
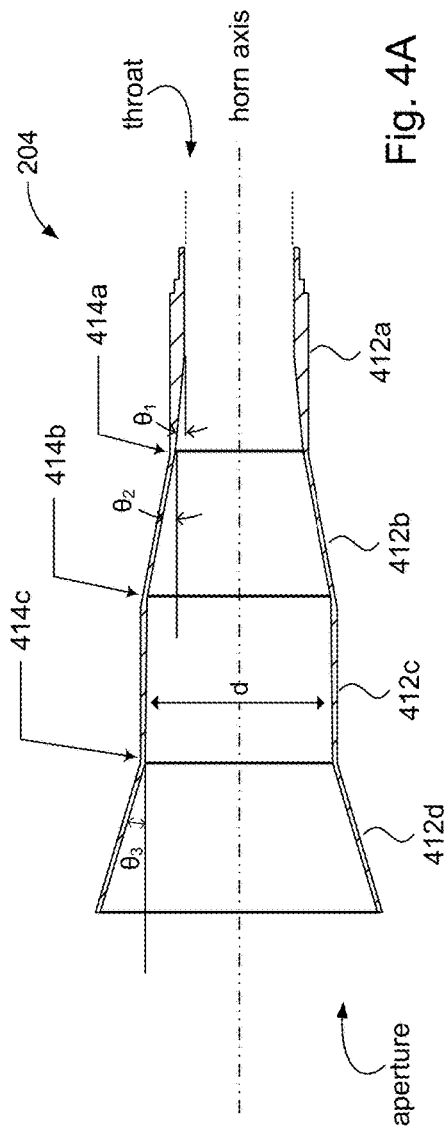

In accordance with the present disclosure, a cross sectional diameter d of the horn 204 may vary along the axial length of the horn 204, thus shaping the horn 204. Referring to FIG. 4A, a cross-sectional view of the horn 402 illustrates that, in some embodiments, horn segments 412a, 412b, 412c, 412d can shape the horn 204 in piece-wise fashion using a linear series of flare angle changes to vary the diameter d. The horn segments 412a, 412b, 412c, 412d may be conical frusta with respective constant flare angles (e.g., the diameter d may vary linearly in a given horn segment), or cylinders (e.g., the diameter d may remain constant in a given horn segment). For example, in the particular embodiment shown in FIG. 4A, horn segments 412b and 412d are conical frusta configured to define respective flare angles $\theta_2$ and $\theta_3$ measured relative to an axis of the horn 204. In the particular embodiment shown, horn segment 412c is a cylinder, having no flare (e.g., the flare angle is 0°, diameter d is constant). In the particular embodiment of FIG. 4A, horn segment 412a includes a portion that is a cylinder and a portion that is a conical frustum.

In the particular embodiment illustrated in FIG. 4A, the horn segments 412a, 412b, 412d have respective flare angles $\theta_1$, $\theta_2$, $\theta_3$, and horn segment 412c has a 0° flare angle. When the horn segments 412a, 412b, 412c, 412d are joined, the flare angle along the axial length of horn 204 varies from $\theta_1$ to $\theta_2$ to 0° and then to $\theta_3$, respectively, at a transition within horn segment 412a and at transitions 414a, 414b, 414c. In some embodiments, the flare angles may be different from one another. In other embodiments, some of the flare angles may be the same.

In some embodiments, the transitions of flare angles along the axial length of the horn 204 may be smooth or gradual. For example, the transitions 414a, 414b, 414c illustrated in FIG. 4A are discrete and have sharp corners. In other embodiments, the transitions 414a, 414b, 414c may be rounded or smoothed out; e.g., by buffing the corners.

Figure 5:
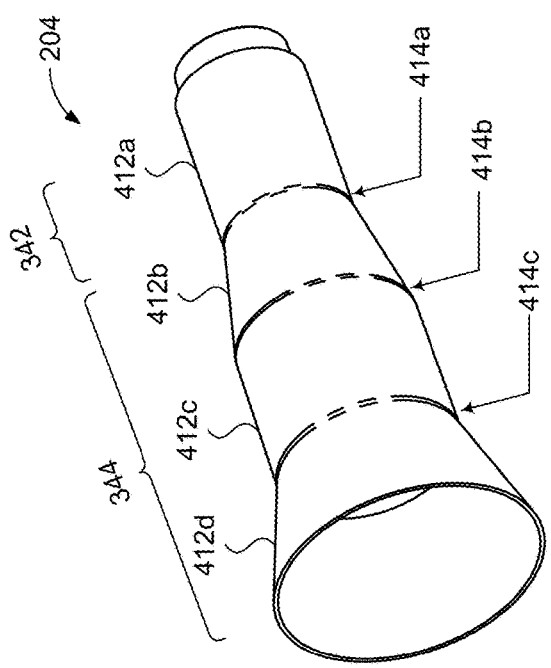
FIG. 5 shows another illustrative embodiment of a horn in accordance with the present disclosure.

Whereas each horn segment 412b, 412c, 412d in FIG. 4A is defined by a corresponding constant flare angle, in other embodiments, the flare angle may change continuously along the axial length of the horn to provide a smooth walled horn. FIG. 5, for example, shows a horn 504 comprising a multi-flare mode conversion section 544 having flare angles that vary in a continuous manner along an axial length of the horn 504. Thus, for example, the flare angle may be represented by a line tangent to each point (e.g., p1, p2, p3) on a cross sectional profile of horn 504 whose angle relative to the axis of the horn 504 varies from one point to the next. Stated differently, the cross sectional diameter d of horn 504 may vary continuously along its axial length. In some embodiments, for example, the change in diameter d may be defined by one or more continuous functions. For example, a spline may be used to define the cross sectional profile of horn 504 to define a flare angle that continuously varies along the axial length of the horn 504.

In some embodiments, the multi-flare mode conversion section may be a single-piece construction. The horn 504 in FIG. 5, for example, comprises a single-piece multi-flare mode conversion section 544. The horn 504 may further comprise a sleeve 542 joined to the multi-flare mode conversion section 544. The sleeve 542 may be configured to couple the horn 504 to a waveguide (e.g., 212, FIG. 2).

Figure 7:
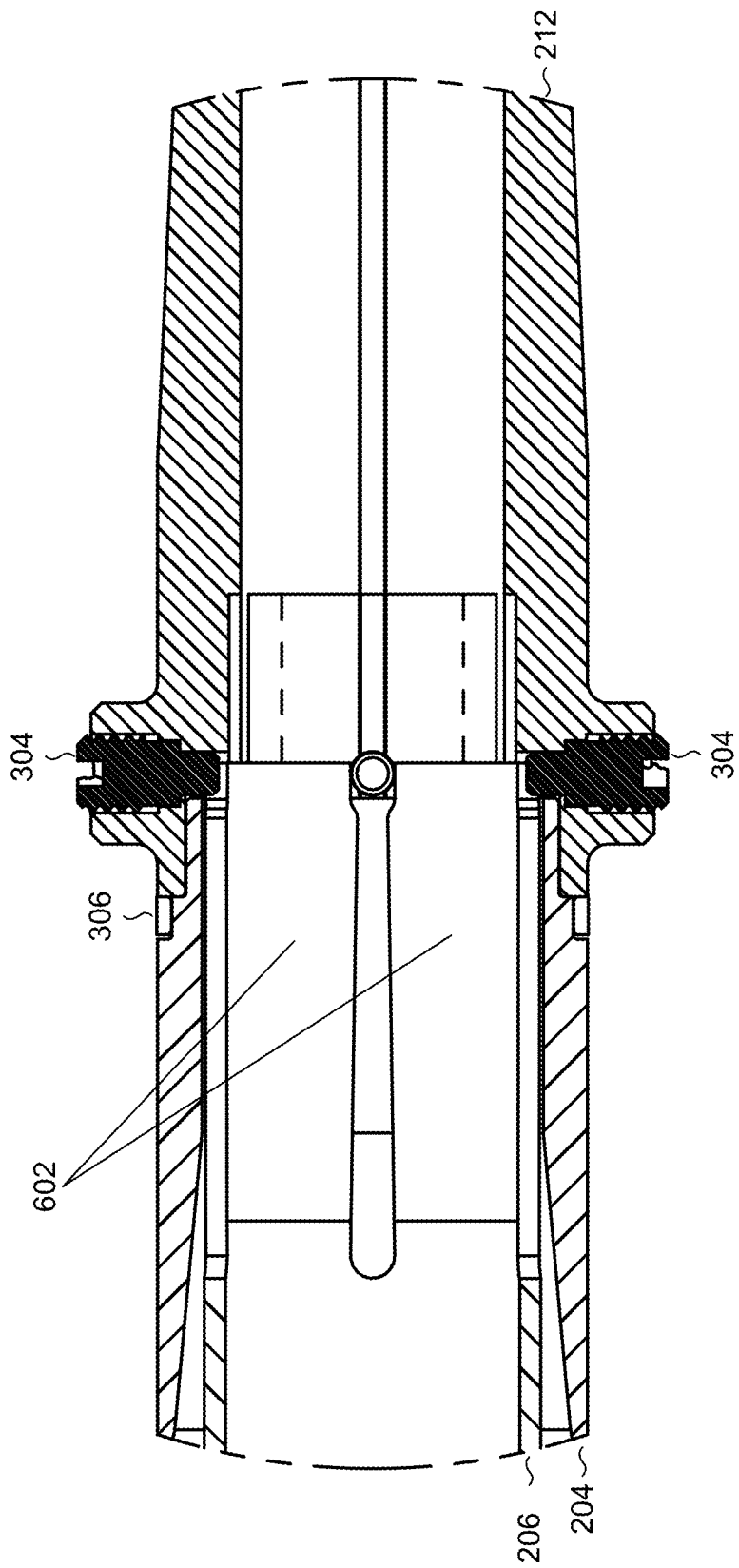
FIG. 7 shows a magnified portion of the cross-sectional view shown in FIG. 3A.

FIG. 6A shows additional details of dielectric insert 206 in accordance with the present disclosure. In some embodiments, the dielectric insert 206 may be a tube, a rod, or other suitable elongate structure. The particular structure selected may be decided based on factors such as mechanical stability, thermal stability, expected operating environment, and so on. As noted above, the first portion 362 of dielectric insert 206 may be configured for being positioned and supported within the horn 204. In some embodiments, the first portion 362 may include fingers 602 configured to secure the dielectric insert 206 to the horn 204. FIGS. 6B and 6C show alternate configurations of the fingers 602. Referring for a moment to FIG. 7, a magnified portion of the cross sectional view shown in FIG. 3A illustrates that dielectric insert 206 may be disposed within the throat of the horn 204. The fingers 602 of the dielectric insert 206 can provide a friction fit with the interior surface of horn 204 for a self-supporting structure. The locking screws 304 may help to secure the dielectric insert 206 in position. In other embodiments, a web-like structure (not shown) may be used to support the dielectric insert 206.

In some embodiments, the dielectric insert 206 may be a dielectric material comprising a quartz fiber weave construction supported by a cyanate-ester resin system that exhibits low-loss RF performance and suitable mechanical properties for the environment. In other embodiments, plastic materials such as Rexolite® plastic or Ultem® plastic may be used. In general, the dielectric insert 206 may comprise any material or combination of materials having suitable dielectric properties, mechanical properties, thermal properties and the like.

Operational characteristics of a feed (e.g., 202, FIG. 2) in accordance with the present disclosure will now be discussed. The term "dominant waveguide mode" refers to the propagation mode in a waveguide that propagates with minimum degradation (e.g., propagates with the lowest cutoff frequency). Furthermore, one of ordinary skill understands that the propagation modes in a waveguide may include:
  transverse electromagnetic (TEM) mode—This is a propagation mode in which neither the electric field nor the magnetic field are in the direction of propagation.
  transverse electric (TE) mode: This is a propagation mode in which there is no electric field in the direction of propagation, but there is a non-zero magnetic field along the direction of propagation.

transverse magnetic (TM) mode: This is a propagation mode in which there is no magnetic field in the direction of propagation, but there is a non-zero electric field along the direction of propagation.

hybrid mode: This is a propagation mode in which there is a non-zero electric field and a non-zero magnetic field along the direction of propagation.

As explained with reference to FIGS. 2-4, the feed 202 comprises a horn 204 and a dielectric insert 206. The multi-flare mode conversion section 344 of horn 204 may function in conjunction with the first portion 362 of dielectric insert 206 to convert a signal between a dominant waveguide mode and a hybrid mode. The hybrid mode may propagate along the second portion 364 of the dielectric insert 206 to define an illumination beam toward a reflector (e.g., 112, FIG. 1A).

In some embodiments, the feed 202 may be used to transmit a transmit signal. Waveguide 212 can propagate the transmit signal in its dominant waveguide mode. The transmit signal may, for example, be provided to the waveguide 212 from a signal source (e.g., transceiver 20) via one or more suitable RF components such as those discussed above. The multi-flare conversion section 344 of the horn 204 may function in conjunction with the first portion 362 of the dielectric insert 206 to convert the transmit signal from the dominant waveguide mode to the hybrid mode. The hybrid mode may then propagate along the second portion 364 of the dielectric insert 206 and radiate largely from the distal end of the dielectric insert 206 to define the illumination beam directed toward the reflector. The reflector can then reflect the illumination beam to form a desired secondary beam in which the reflected electromagnetic energy adds constructively in a desired direction (e.g. the direction corresponding to the satellite), while partially or completely cancelling out in all other directions.

In other embodiments, the feed 202 may be used to receive a receive signal. The reflector can cause electromagnetic energy of the received signal to converge at the location of the feed 202 if an incident plane wave arrives from a desired direction (e.g., the direction corresponding to the satellite). The second portion 364 of the dielectric insert 206 can cause the converged electromagnetic energy to propagate along it in the hybrid mode. The multi-flare conversion section 344 of the horn 204 may function in conjunction with the first portion 362 of the dielectric insert 206 to convert the receive signal from the hybrid mode to the dominant waveguide mode. Waveguide 212 can then propagate the transmit signal in its dominant waveguide mode and provide the transmit signal to a receiver (e.g., transceiver 20) via one or more suitable RF components such as those discussed above.

In other embodiments, the feed 202 may be used to both transmit a transmit signal and receive a receive signal. The operation may, for example, be full duplex, may be time duplexed, or may be a combination of time duplexed with different and varying intervals of transmit and receive signal flow.

The radiation pattern from the hybrid mode has the often desirable properties of circular symmetry or pseudo circular symmetry in the main beam to a significant degree and corresponding low off axis cross-polarization energy. The hybrid mode radiation pattern is further defined as having high purity Huygens polarized source properties. In some embodiments, the dominant waveguide mode is a TE mode, which is typical in square waveguides and circular waveguides.

In accordance with the present disclosure, the hybrid mode produced by feed 202 may have minimal or at least reduced cross-polarization energy. Cross polarization refers to the polarization orthogonal to the polarization being discussed. For instance, if the fields from an antenna are meant to be horizontally polarized, the cross-polarization in this case would be vertical polarization. As another example, if the polarization is right hand circularly polarized, the cross-polarization would be left hand circularly polarized. The cross polarization energy may be expressed as a power level in units of dB, indicating how many decibels below the desired polarization's power level the cross polarization power level is, and is known as cross-polarization discrimination (XPD). In some embodiments, the XPD of the illumination beam may be less than −24.5 dB.

In some embodiments, the signal may comprise several frequencies (frequency components). The multi-flare mode conversion section 344 of horn 204 may function in conjunction with the first portion 362 of dielectric insert 206 to convert the signal between a dominant waveguide mode and a hybrid mode at each frequency. In some embodiments, the ratio between the frequency of the highest frequency component in the signal and the frequency of the lowest frequency component in the signal may be about 1.5 or higher. In some embodiments, the axial ratio of the illumination beam may be less than 1 dB at each of the frequencies when expressed as the ratio of the large quantity over the small quantity.

In accordance with the present disclosure, the dielectric insert 206 can improve the directivity of the illumination beam. In some embodiments, directivity may be computed as a ratio of the power of the signal measured along the axis of propagation to the total power in the signal. Propagation of the hybrid mode may be largely confined to the second portion 364 of the dielectric insert 206 to improve directivity. For example, in a configuration comprising only a horn and no dielectric insert, the illumination beam propagates along the horn and radiates from the aperture of the horn. The directivity of this illumination beam may be less than the directivity of an illumination beam that propagates along a dielectric insert (e.g., 206) and radiates from the distal end of the dielectric insert. The improved directivity may be useful in a feed array (e.g., 1000, FIG. 10) because increased directivity can mitigate the challenge of having to isolate the individual horns in the feed array.

Increasing the length L of the second portion 364 of the dielectric insert 206 may increase feed directivity. However, the distribution of energy in the illumination beam decreases as the length L increases. Therefore, in a particular implementation, design decisions might be made to trade off energy distribution in the illumination beam for directivity of the secondary beam of the reflector. The reflector edge illumination values can be an indication of optimum illumination and the trade off between the portion of energy illuminating the reflector and the portion of energy spilling past the reflector (spillover energy). An edge illumination of approximately −8 to −14 dB relative to a central peak value can result in near optimum net efficiency and can be achieved with a feed assembly in accordance with the present disclosure. In some embodiments, the edge illumination may be less than −14 dB (e.g., −18 dB). In an example, a dual band full duplex feed may be designed for a near optimum illumination in a lower frequency band, and under illuminate the reflector in a higher frequency band. A single transmit or receive reflector with a SFPB horn design in either a focused or non-focused configuration with dense contiguous feeds in an array without the dielectric insert may have an edge illumination value of approximately −5 dB relative to a central peak value and will be substantially below the optimum illumination as a result of the spillover energy. The portion of cross-polarization energy detracts from the overall performance of the antenna system when frequency reuse and polarization are applied to provide isolated areas of coverage in the form of spot beams. Minimizing the cross-polarization is an often applied design objective in systems that use polarization for coverage signal isolation.

Figure 8:
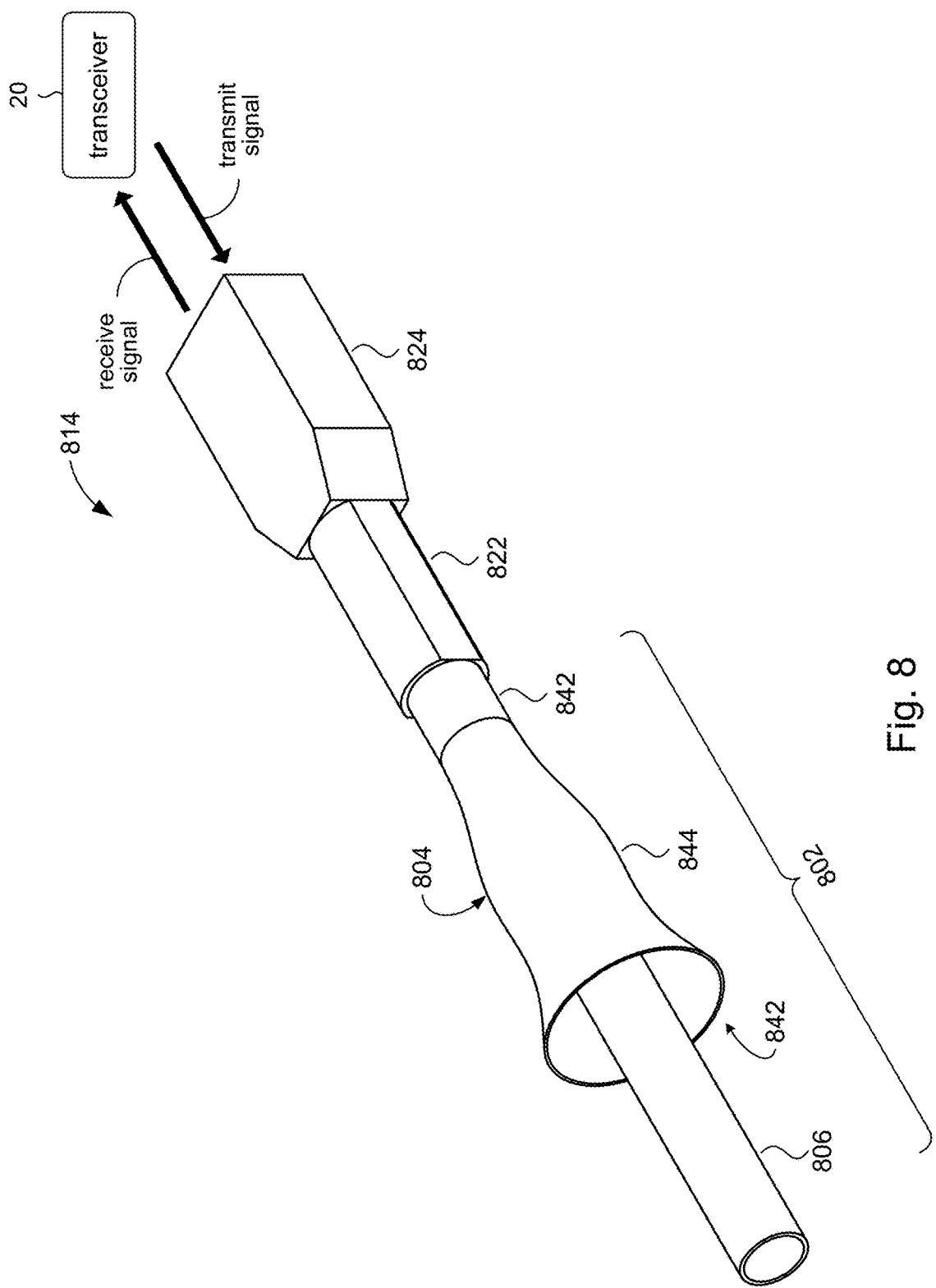
FIG. 8 is an isometric view of a feed assembly in accordance with another embodiment of the present disclosure.

A feed assembly (e.g., 114, FIG. 2) in accordance with the present disclosure may be used with any suitable RF component. FIG. 8, for example, shows an illustrative embodiment of a feed assembly 814 in accordance with the present disclosure. The feed 802 may comprise a horn 804 and a dielectric insert 806. The horn 804 may comprise a single-piece multi-flare mode conversion section 844 coupled to a sleeve 842. The dielectric insert 806 may have a first portion (not shown) disposed within the horn 804, and a second portion that extends beyond an aperture 842 of the horn 804.

In some embodiments, the feed assembly 814 may further comprise a housing 824 which may house an RF component (not shown). In some embodiments, the RF component may be a diplexer-polarizer unit (826, FIG. 8A). It will be appreciated, of course, that in other embodiments, the feed 802 may be used with RF components other than a diplexer-polarizer. For example, in some embodiments, the feed 802 may be used in combination with RF components such as a four-port OMT, a two-port OMT, a single-band septum polarizer, a dual-band septum polarizer, a polarizer and a filter, and so on.

Figure 8A:
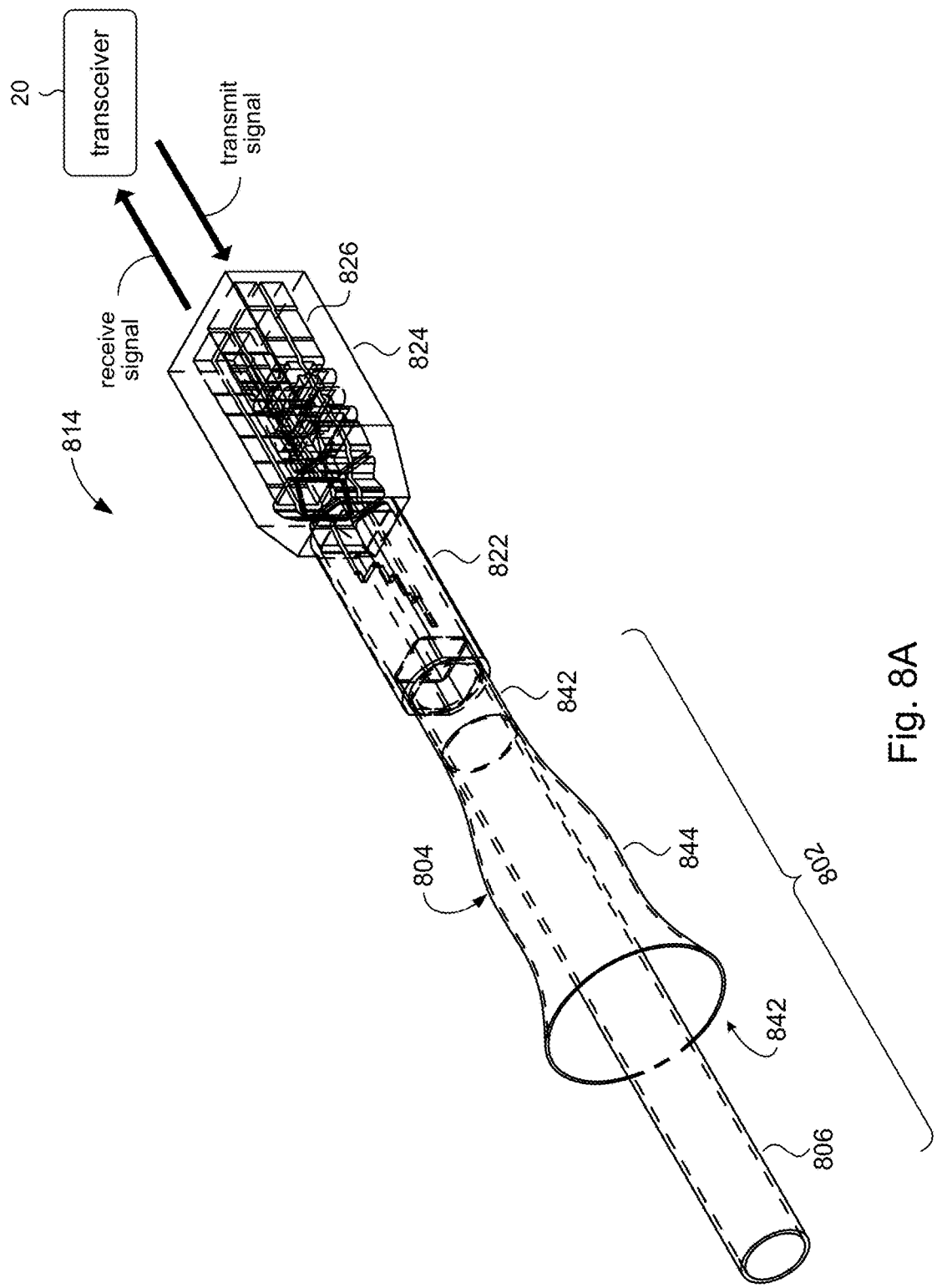
FIG. 8A is a hidden line view of the feed assembly illustrated in FIG. 8.

Referring to FIG. 8A, the hidden line view of feed assembly 814 shown in the figure illustrates that a portion of the dielectric insert 806 may extend into the horn 804 and through the multi-flare mode conversion section 844 where the dielectric insert 806 can be supported at the throat of horn 804. A portion of the dielectric insert 806 may extend beyond the aperture 842 of horn 804. The figure shows the diplexer-polarizer unit 826 disposed within the housing 824.

Figure 9:
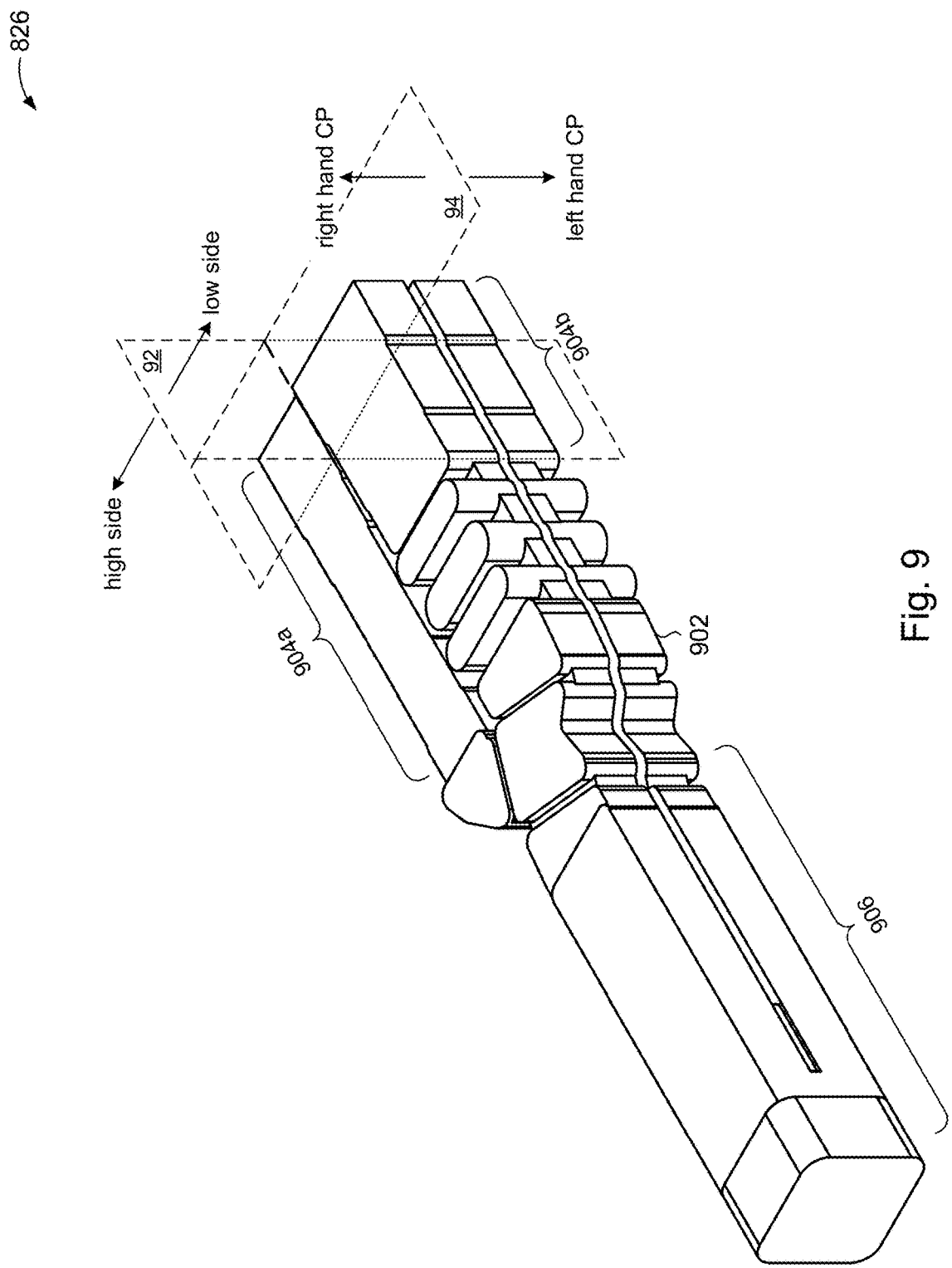
FIGS. 9 and 9A illustrate, respectively, an isometric view and a hidden line view of a diplexer-polarizer.

FIG. 9 shows an illustrative embodiment of diplexer-polarizer unit 826 depicted in FIG. 8A. The diplexer-polarizer unit 826 may comprise a diplexer 902, waveguides 904a, 904b coupled to the diplexer 902, and a polarizer 906. In some embodiments, the diplexer 902 may be a 4-port diplexer. The waveguides may be divided into high-side waveguides 904a to transmit and receive signals in a high frequency band and low-side waveguides 904b to transmit and receive signals in a low frequency band, as indicated by dividing plane 92. Merely to provide an illustrative example of the use of a diplexer-polarizer for a dual-band full-duplex configuration, the high frequency band may span a range of about 27.5-31.0 GHz (a bandwidth of about 3.5 GHz) and the low frequency band may span a range of about 17.7-21.2 GHz (a bandwidth of about 3.5 GHz).

The waveguides 904a, 904b may be further divided according to the polarization of the signal propagated in the waveguides, as indicated by dividing plane 94. For example, the high-side waveguides 904a may comprise one waveguide configured to transmit and receive right hand circularly polarized signals and another waveguide configured to transmit and receive left hand circularly polarized signals. Similarly, the low-side waveguides 904b may comprise one waveguide to transmit and receive right hand circularly polarized signals and another waveguide to transmit and receive left hand circularly polarized signals.

Figure 9A:
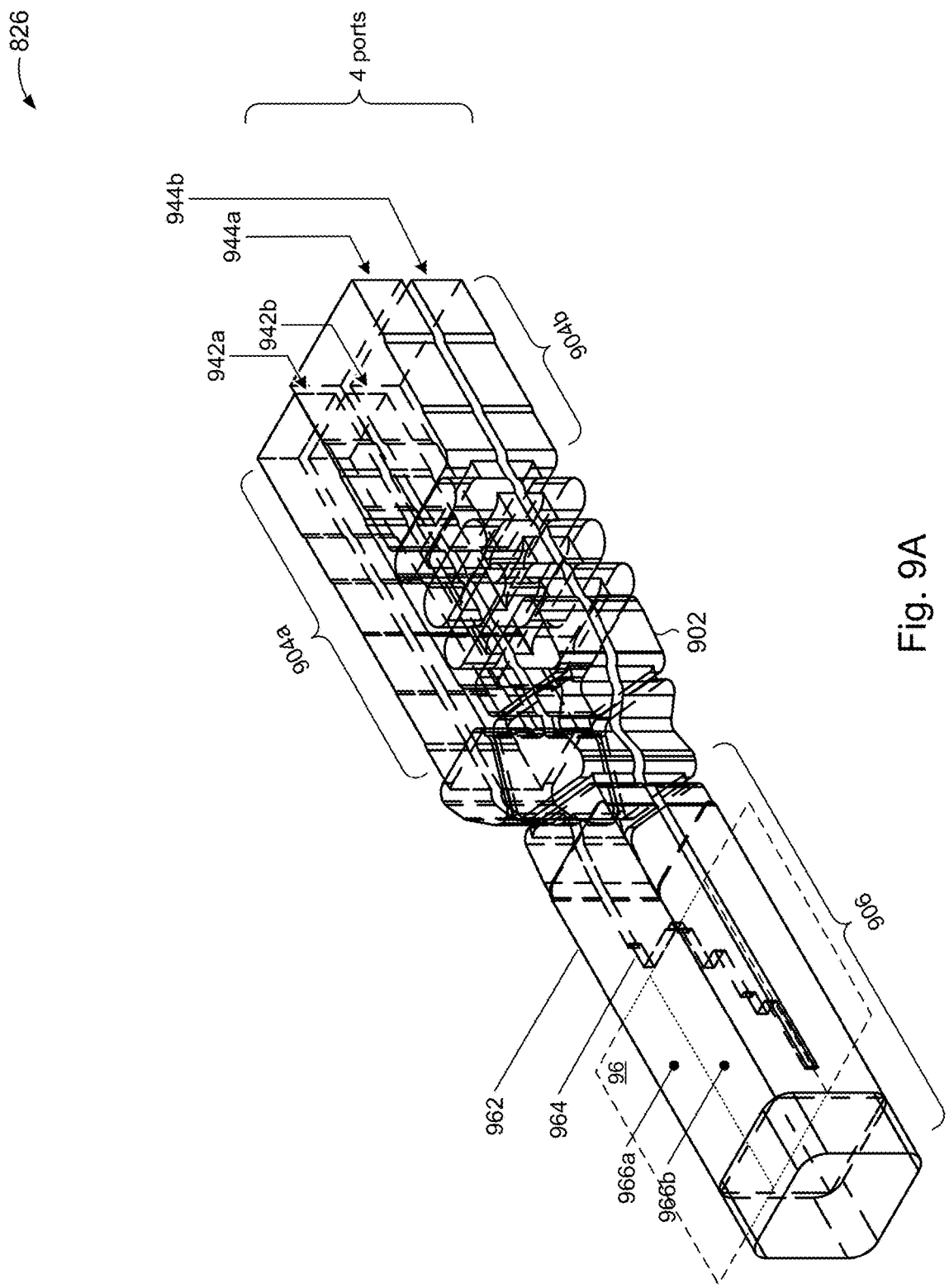

FIG. 9A is a hidden line representation of the diplexer-polarizer unit 826. In some embodiments, the polarizer 906 may comprise a square waveguide 962 having a staircase septum polarizer 964 disposed within the square waveguide 962. The septum polarizer 964 may divide the waveguide 962 into a first waveguide portion 966a and a second waveguide portion 966b, as indicated in the figure by the dividing plane 96. The septum polarizer 964 may be configured to convert signals between a polarized state in the waveguide 962 and a first polarization component in the first waveguide portion 966a and a second polarization component in the second waveguide portion 966b. In some embodiments, the first polarization component may correspond to a first polarization at the aperture 842 of horn 802 shown in FIG. 8. Similarly, the second polarization component may correspond to a second polarization at the aperture 842 of horn 802. In some embodiments, the first polarization may be a first circular polarization and the second polarization may be a second circular polarization different from the first circular polarization.

The hidden line representation of FIG. 9A reveals that waveguides 904a comprise high-side ports 942a, 942b and waveguides 904b comprise low-side ports 944a, 944b. In some embodiments, the ports 942a and 944a may be configured to transmit and receive right hand circularly polarized signals, and the ports 942b, 944b may be configured to transmit and received left hand circularly polarized signals.

Referring to FIG. 10, in some embodiments, a feed array 1000 may comprise an array of feed assemblies 1002 in accordance with the present disclosure. Illustrative examples of feed assemblies 1002 are shown in FIGS. 2 and 8. In some embodiments, the spacing (e.g., center-to-center spacing, s) between the horns of adjacent feed assemblies 1002 may be the same. Merely to illustrate, for example, in some embodiments, the spacing s between the horns of adjacent feed assemblies 1002 may be about 2.5 wavelengths of a highest frequency of the signal to be transmitted or received. In other embodiments, the spacing s between horns of adjacent feed assemblies 1002 may vary.

The feed assemblies 1002 comprising the feed array 1000 may be arranged in a regular pattern. In some embodiments, for example, the feed assemblies 1002 may be arranged in a lattice. For example, feed assemblies 1002 shown in FIG. 10 are arranged in a hexagonal lattice. In some embodiments, the feed assemblies 1002 may be arranged in a rectilinear pattern. In other embodiments, the feed assemblies 1002 may be arranged in a triangular pattern. In still other embodiments, the feed assemblies 1002 may be arranged in an irregular pattern.

In some embodiments, the feed assemblies 1002 comprising the feed array 1000 may be arranged in a planar configuration. For example, the feed assemblies 1002 may be disposed on a planar surface so that the distal ends of the dielectric inserts of the feed assemblies 1002 lie on a plane. In other embodiments, the feed assemblies 1002 comprising the feed array 1000 may be arranged in non-planar configurations. For example, in some embodiments, the feed array 1000 may be arranged on a convex surface or a concave surface relative to the curvature of the reflector (e.g., 112, FIG. 1A). More generally, in other embodiments, the feed array 1000 may be arranged on a surface having any suitable contour.

Figure 11:
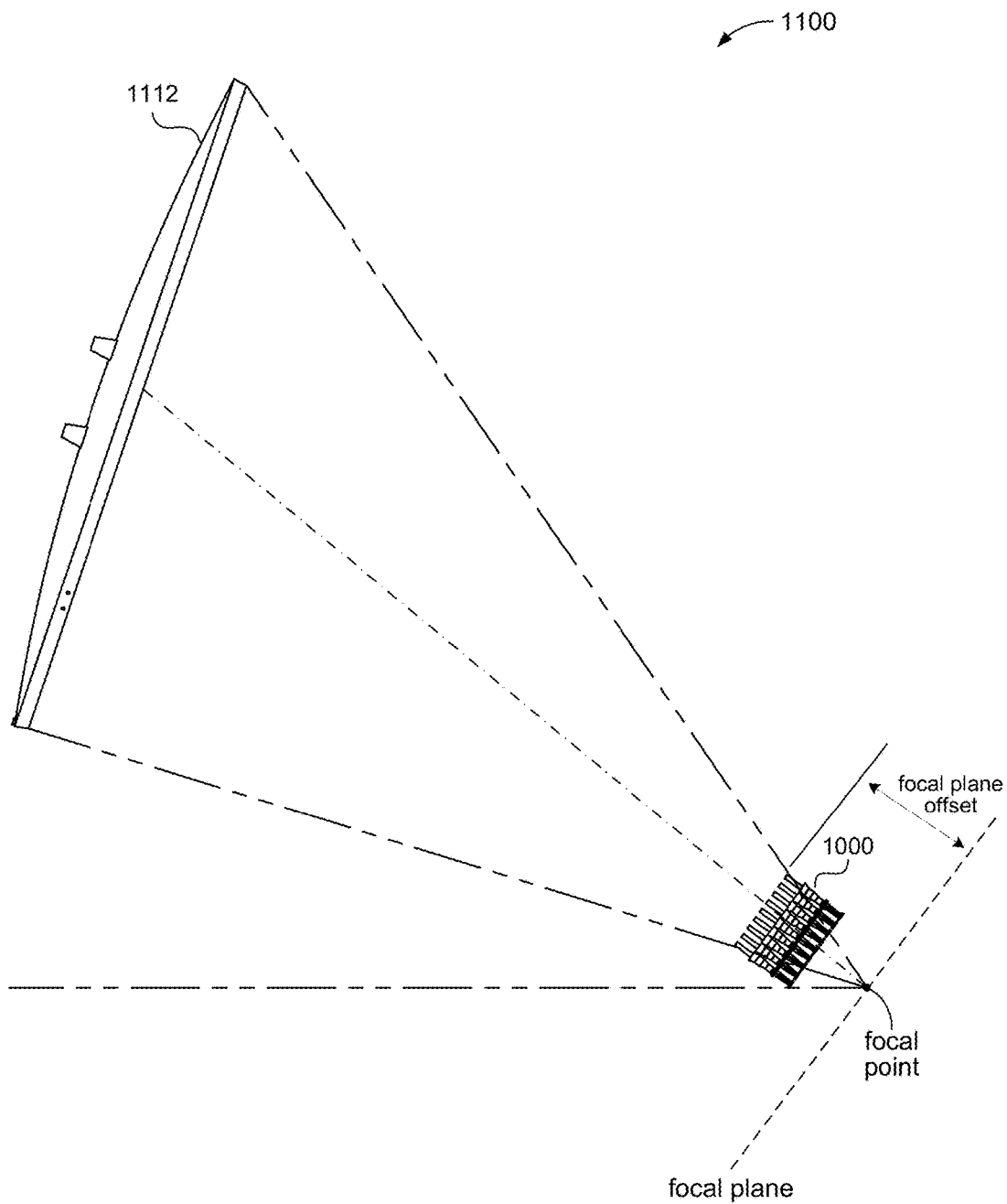
FIG. 11 illustrates a satellite reflector antenna configured with a feed array in accordance with the present disclosure.

The feed array 1000 may be incorporated in a reflector antenna of a satellite. FIG. 11, for example, shows a reflector antenna 1100 for a satellite (e.g., satellite 105, FIG. 1) that incorporates feed array 1000. The reflector antenna 1100 is an example of an offset fed parabolic reflector configuration. However, it will be appreciated that the feed array 1000 may be incorporated in other antenna configurations.

In the configuration shown in FIG. 11, the feed array 1000 lies within the focal plane of the reflector 1112. In other embodiments, the feed array 1000 may lie on the focal plane, or beyond the focal plane of reflector 1112.

Figure 12:
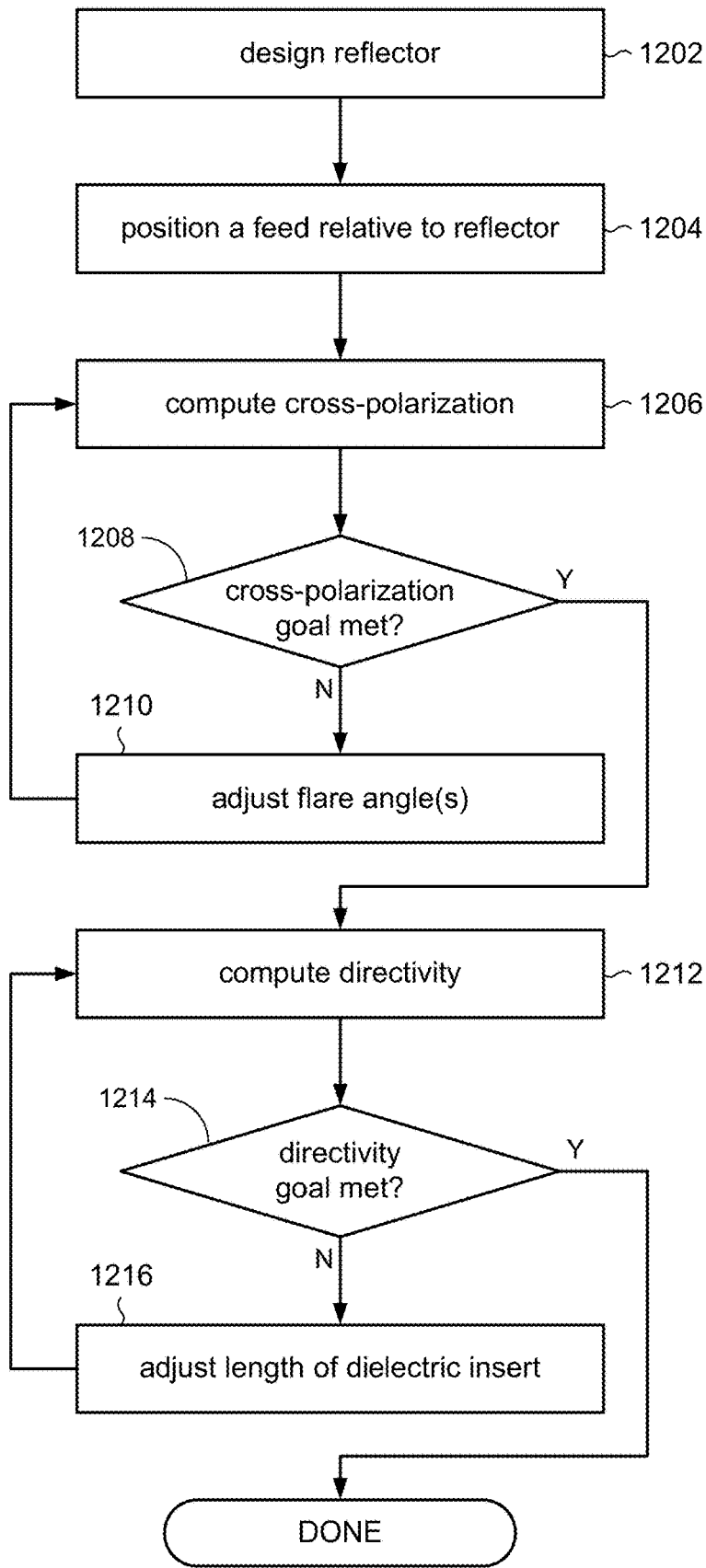
FIG. 12 illustrates an example of a design flow to design a feed in accordance with the present disclosure.

Referring to FIG. 12, a process for designing a feed (e.g., 202, FIG. 2) in accordance with the present disclosure will be explained. In some embodiments, the process may be performed using suitable simulation tools. The feed may be designed using, for example, the High Frequency Structure Simulator (HFSS) software available from Ansys, Inc. Alternatively, other software may be used to design the feed.

At block 1202, a suitable reflector (e.g., 112, FIG. 1A) design may be selected. For example, the shape of the reflector may be specified, the dimensions of the reflector may be specified, and so on.

At block 1204, a feed may be positioned relative to the reflector. This may include designing a horn (e.g., 204, FIG. 2) by selecting an initial number of flare angles and their initial values, and designing a dielectric insert (e.g., 206, FIG. 2) by selecting an initial length L (FIG. 3A) of the portion of the dielectric insert that extends beyond the aperture of the horn.

At block 1206, an illumination beam directed toward the reflector may be simulated. A cross-polarization of the illumination beam may be computed. If at block 1208, the cross-polarization is greater than a predetermined value, then processing may proceed to block 1210.

At block 1210, one or more of the flare angles may be adjusted. Processing may return to block 1206, where a cross-polarization is recomputed with the adjusted flare angle(s). The flare angles may be iteratively adjusted in this way until the cross-polarization of the illumination beam directed toward the reflector becomes less than or equal to the predetermined value (goal). At block 1208, when the cross-polarization goal has been met, processing may continue to block 1212.

At block 1212, a directivity metric of the illumination beam that is directed toward the reflector may be computed. If at block 1214, the directivity metric is not equal to a predetermined value, then processing may proceed to block 1216. At block 1216, the length L of the portion of the dielectric insert that extends beyond the aperture of the horn may be adjusted.

In some embodiments, the length may be increased or decrease depending on whether the directivity computed at block 1212 is greater than or less than the predetermined value. Processing may return to block 1212, where a directivity metric is recomputed with the adjusted length. The length L may be iteratively adjusted in this way until the directivity metric of the illumination beam directed toward the reflector reaches the predetermined value (goal), at which time the design process may complete.

Referring back to block 1204, in some embodiments, a feed array (e.g., 1000, FIG. 10) may be positioned relative to the reflector. At block 1206, the cross-polarization may be computed for an illumination beam of at least one of the feeds in the feed array directed towards the reflector. At block 1208, the flare angles of each of the feeds comprising the feed array may be adjusted, and the process may be iterated until the cross-polarization of the illumination beam becomes less than or equal to a predetermined value. Similarly, in blocks 1212-1216, the lengths of each dielectric insert in the feed array may be iteratively adjusted until the directivity metric of an illumination beam from at least one of the feeds in the feed array reaches a predetermined value.

Referring back to block 1206, in some embodiments, cross-polarization may be computed for two or more angles of the illumination beam. At block 1208, the cross-polarization goal may be that the cross-polarization for each angle of the illumination beam be less than or equal to a predetermined value. In some embodiments, each angle may have a corresponding predetermined value that the cross-polarization is compared to.

In other embodiments, at block 1206, cross-polarization may be computed for two or more frequencies of the illumination beam. At block 1208, the cross-polarization goal may be that the cross-polarization for each frequency be less than or equal to a predetermined value. In some embodiments, each frequency may have a corresponding predetermined value that the cross-polarization is compared to.

Figure 13:
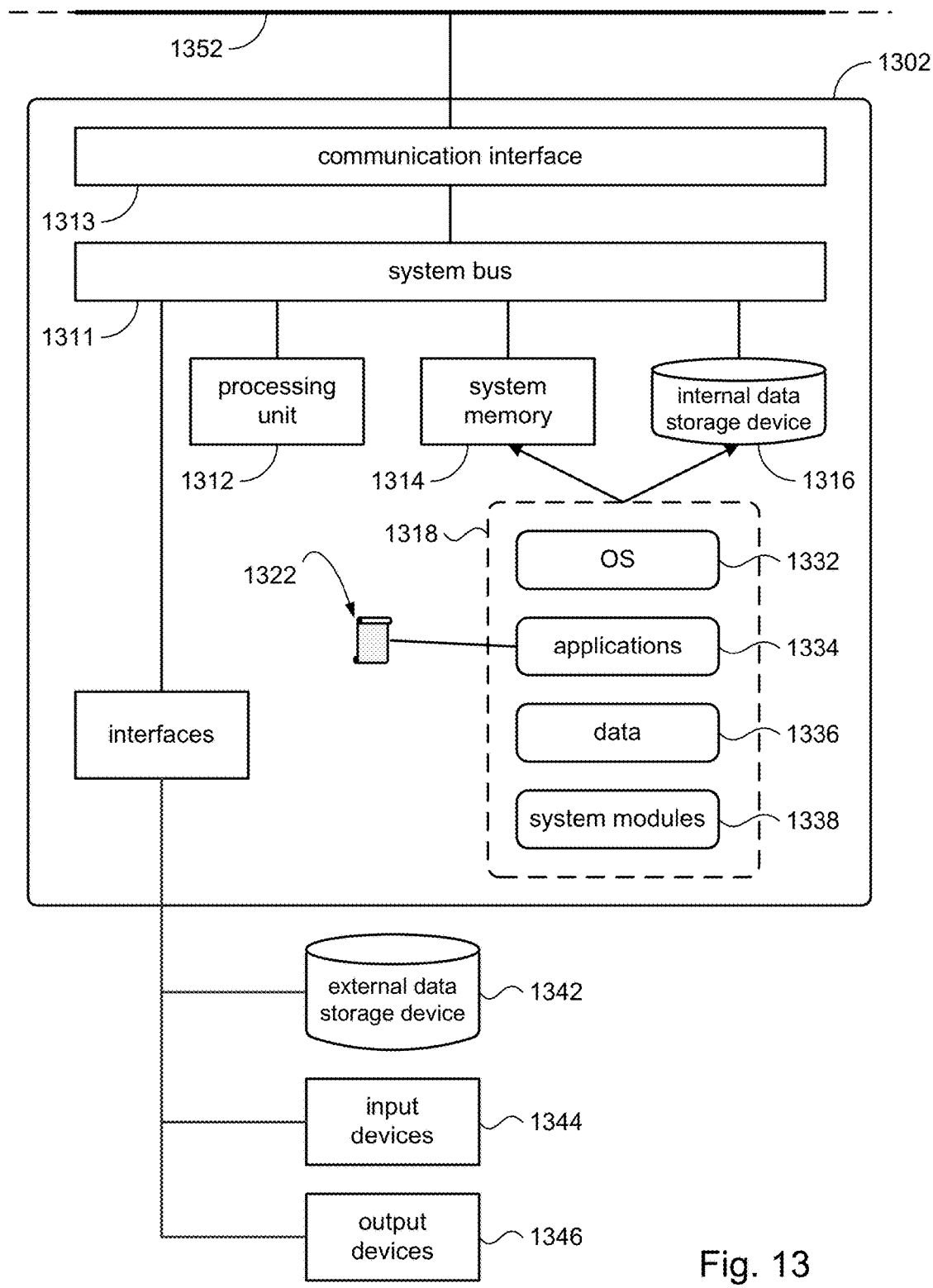
FIG. 13 shows a computer system in accordance with some embodiments of the present disclosure.

Referring to FIG. 13, an illustrative implementation of a design system to facilitate the design of a feed (e.g., 202, FIG. 2) may include a computer system 1302 having a processing unit 1312, a system memory 1314, and a system bus 1311. The system bus 1311 may connect various system components including, but not limited to, the processing unit 1312, the system memory 1314, an internal data storage device 1316, and a communication interface 1313. In a configuration where the computer system 1302 is a mobile device (e.g., smartphone, computer tablet), the internal data storage 1316 may or may not be included.

The processing unit 1312 may comprise a single-processor configuration, or may be a multi-processor architecture. The system memory 1314 may include read-only memory (ROM) and random access memory (RAM). The internal data storage device 1316 may be an internal hard disk drive (HDD), a magnetic floppy disk drive (FDD, e.g., to read from or write to a removable diskette), an optical disk drive (e.g., for reading a CD-ROM disk, or to read from or write to other high capacity optical media such as the DVD, and so on). In a configuration where the computer system 1302 is a mobile device, the internal data storage 1316 may be a flash drive.

The internal data storage device 1316 and its associated non-transitory computer-readable storage media provide nonvolatile storage of data, data structures, computer-executable instructions, and so forth. Although the description of computer-readable media above refers to a HDD, a removable magnetic diskette, and a removable optical media such as a CD or DVD, it is noted that other types of media which are readable by a computer, such as zip drives, magnetic cassettes, flash memory cards, cartridges, and the like, may also be used, and further, that any such media may contain computer-executable instructions for performing the methods disclosed herein.

The system memory 1314 and/or the internal data storage device 1316 may store a number of program modules, including an operating system 1332, one or more application programs 1334, program data 1336, and other program/system modules 1338. For example, the application programs 1334, which when executed, may cause the computer system 1302 to perform method steps of FIG. 12. The application programs 1334 may also include simulation software (e.g., the HFSS software mentioned above). An external data storage device 1342 may be connected to the computer system 1302, for example, to store the design data for a feed or feed array.

Access to the computer system 1302 may be provided by a suitable input device 1344 (e.g., keyboard, mouse, touch pad, etc.) and a suitable output device 1346, (e.g., display screen).

In a configuration where the computer system 1302 is a mobile device, input and output may be provided by a touch sensitive display.

The computer system 1302 may operate in a networked environment using logical connections via wired and/or wireless communications to one or more remote computers (not shown) over a communication network 1352. The communication network 1352 may be a local area network (LAN) and/or larger networks, such as a wide area network (WAN).

Embodiments described herein can provide a very light weight solution for enhanced aperture directivity to achieve a near optimum efficiency that improves off-axis cross-polarization that is applicable to high through-put satellite antenna architectures. The light weight attribute can be increasingly important for arrays of feeds of large numbers. The shaped horn affords optimizing gain, cross-polarization and impedance match in a feed array environment or for isolated feeds.

The above description illustrates various embodiments of the present disclosure along with examples of how aspects of the particular embodiments may be implemented. The above examples should not be deemed to be the only embodiments, and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

What is claimed is:

1. An antenna comprising:
    a reflector; and
    an array of feeds to illuminate the reflector and spaced away from a focal plane of the reflector, each feed of the array of feeds comprising:
    a horn including a multi-flare mode conversion section having a plurality of flare angles between a first end and a second end;
    a dielectric insert including a first portion extending through at least part of the multi-mode flare conversion section and having a plurality of slots extending along the dielectric insert, and further including a second portion extending beyond an aperture of the horn to define an illumination beam towards the reflector, wherein
    the dielectric insert is self-supported via surfaces at an end of the first portion of the dielectric insert between the slots in frictional contact with an interior surface of the horn.

2. The antenna of claim 1, wherein the plurality of slots define a plurality of fingers at an end of the first portion of the dielectric insert.

3. The antenna of claim 1, wherein the horn further includes a retention feature to further retain the dielectric insert within the horn.

4. The antenna of claim 3, wherein the retention feature comprises a plurality of screws.

5. The antenna of claim 1, wherein a center-to-center spacing between horns of adjacent feeds of the array of feeds is less than 2.5 wavelengths of a highest operational frequency of each feed.

6. The antenna of claim 1, wherein spacing between horns comprising the array of feeds is the same.

7. The antenna of claim 1, wherein the array of feeds is arranged in a two-dimensional plane.

8. The antenna of claim 1, wherein the array of feeds define a non-planar surface.

9. The antenna of claim 1, wherein directivity of the illumination beam is greater than directivity due to the aperture of the horn.

10. The antenna of claim 1, wherein an axial ratio of the illumination beam is less than 1 dB at each of a plurality of frequencies.

* * * * *